United States Patent
Ohyama (10) Patent No.: US 10,562,797 B2
(45) Date of Patent: Feb. 18, 2020

(54) LIQUID TREATMENT APPARATUS INCLUDING FLOW CHANNEL, FIRST AND SECOND ELECTRODES, INSULATOR SURROUNDING LATERAL SURFACE OF FIRST ELECTRODE, GAS SUPPLY DEVICE, AND POWER SUPPLY SOURCE

(71) Applicant: Panasonic Intellectual Property Management Co., Ltd., Osaka (JP)

(72) Inventor: Tatsushi Ohyama, Osaka (JP)

(73) Assignee: PANASONIC INTELLECTUAL PROPERTY MANAGEMENT CO., LTD., Osaka (JP)

(\*) Notice: Subject to any disclaimer, the term of this patent is extended or adjusted under 35 U.S.C. 154(b) by 93 days.

(21) Appl. No.: 15/901,555

(22) Filed: Feb. 21, 2018

(65) Prior Publication Data

US 2018/0261435 A1 Sep. 13, 2018

(30) Foreign Application Priority Data

Mar. 8, 2017 (JP) .................. 2017-044242

(51) Int. Cl.
C02F 1/46 (2006.01)
H01J 37/32 (2006.01)
H05H 1/24 (2006.01)

(52) U.S. Cl.
CPC ........ *C02F 1/4608* (2013.01); *H01J 37/3255* (2013.01); *H01J 37/32449* (2013.01);
(Continued)

(58) Field of Classification Search
CPC .............. C02F 1/4608; C02F 2305/023; C02F 2301/043; C02F 2301/046; C02F 2303/04; H01J 37/32807; H01J 37/3244; H01J 37/32541; H01J 37/32761; H01J 2237/038; A61L 12/14; B01J 19/088
See application file for complete search history.

(56) References Cited

U.S. PATENT DOCUMENTS 4,881,722 A 11/1989 Koizumi et al.
5,316,739 A 5/1994 Yoshikawa et al.
(Continued)

FOREIGN PATENT DOCUMENTS

JP 63-118941 U 8/1988
JP 6-065739 3/1994
(Continued)

*Primary Examiner* — Lessanework Seifu
(74) *Attorney, Agent, or Firm* — McDermott Will & Emery LLP (57) ABSTRACT

A liquid treatment apparatus includes a flow channel, first and second electrodes at least part of each of which is disposed within the flow channel, an insulator, a gas supply device, and a power supply source that applies a voltage between the first and second electrodes and generates plasma. The insulator has a tubular shape and an opening on an end surface of the insulator, and surrounds a lateral surface of the first electrode with a space interposed between the insulator and the first electrode. The gas supply device supplies and ejects a gas into the liquid via the opening. At least part of the flow channel extends in a first direction which is inclined with respect to a horizontal direction so that the liquid flows obliquely upward with respect to the horizontal direction. The opening is positioned within the at least part of the flow channel.

6 Claims, 7 Drawing Sheets

(52) U.S. Cl.
CPC .. *H01J 37/32541* (2013.01); *H01J 37/32761* (2013.01); *H05H 1/2406* (2013.01); *C02F 2301/043* (2013.01); *C02F 2301/046* (2013.01); *C02F 2303/04* (2013.01); *C02F 2305/023* (2013.01); *H01J 2237/038* (2013.01); *H05H 2001/2412* (2013.01); *H05H 2001/2431* (2013.01); *H05H 2240/10* (2013.01)

(56) References Cited

U.S. PATENT DOCUMENTS

2014/0231329 A1    8/2014  Imai et al.
2015/0225264 A1    8/2015  Fujikane et al.

FOREIGN PATENT DOCUMENTS

| | | |
|---|---|---|
| JP | 9-171899 | 6/1997 |
| JP | 2009-022864 | 2/2009 |
| JP | 2015-033694 | 2/2015 |
| JP | 2015-136644 | 7/2015 |
| WO | 2015/072049 | 5/2015 |

LIQUID TREATMENT APPARATUS INCLUDING FLOW CHANNEL, FIRST AND SECOND ELECTRODES, INSULATOR SURROUNDING LATERAL SURFACE OF FIRST ELECTRODE, GAS SUPPLY DEVICE, AND POWER SUPPLY SOURCE

BACKGROUND

1. Technical Field

The present disclosure relates to a liquid treatment apparatus for performing treatments of liquids by utilizing plasma.

2. Description of the Related Art

A technology for purifying or sterilizing liquids by utilizing plasma is known. For example, Japanese Unexamined Patent Application Publication Nos. 2015-33694 and 2015-136644 and International Publication No. 2015/072049 disclose a liquid treatment apparatus that supplies a gas into a liquid and generates plasma in the supplied gas.

SUMMARY

In one general aspect, the techniques disclosed here feature a liquid treatment apparatus including a flow channel, first and second electrodes, an insulator, a gas supply device, and a power supply source. The flow channel is provided for causing a liquid to flow therethrough. At least part of the first electrode is disposed within the flow channel. At least part of the second electrode is disposed within the flow channel. The insulator has a tubular shape and an opening on an end surface of the insulator, and surrounds a lateral surface of the first electrode with a space interposed between the insulator and the lateral surface of the first electrode. The gas supply device supplies a gas to the space and ejects the gas into the liquid via the opening. The power supply source applies a voltage between the first and second electrodes and generates plasma. At least part of the flow channel extends in a first direction which is inclined with respect to a horizontal direction so that the liquid flows obliquely upward with respect to the horizontal direction. The opening is positioned within the at least part of the flow channel.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Overview of the Disclosure

In a known liquid treatment apparatus, discharging is not stabilized, that is, plasma is not stably generated.

A liquid treatment apparatus according to an aspect of the present disclosure includes a flow channel, first and second electrodes, an insulator, a gas supply device, and a power supply source. The flow channel is provided for causing a liquid to flow therethrough. At least part of the first electrode is disposed within the flow channel. At least part of the second electrode is disposed within the flow channel. The insulator has a tubular shape and an opening on an end surface of the insulator, and surrounds a lateral surface of the first electrode with a space interposed between the insulator and the lateral surface of the first electrode. The gas supply device supplies a gas to the space and ejects the gas into the liquid via the opening. The power supply source applies a voltage between the first and second electrodes and generates plasma. At least part of the flow channel extends in a first direction which is inclined with respect to a horizontal direction so that the liquid flows obliquely upward with respect to the horizontal direction. The opening is positioned within the at least part of the flow channel.

With this configuration, the amount of plasma emission increases and discharging can be stabilized.

The horizontal direction is perpendicular to the direction of gravity, which may be checked by a spirit level, for example.

The liquid treatment apparatus may further include a reaction tank containing the flow channel. The insulator may pass through a wall of the reaction tank and be fixed to the reaction tank.

With this configuration, adjusting of the configuration or the orientation of the reaction tank can easily tilt the flow channel upward with respect to the horizontal direction, and can also easily adjust the tilt angle of the flow channel. By suitably adjusting the tilt angle, discharging stability can be increased.

The reaction tank may be elongated in a direction which intersects the first direction.

With this configuration, merely placing the reaction tank on a horizontal plane can tilt the flow channel upward with respect to the horizontal direction. For example, the reaction tank can stably be supported on the horizontal plane in the state in which the flow channel tilts upward with respect to the horizontal direction.

The reaction tank may be elongated in the first direction and may be disposed such as to be inclined with respect to the horizontal direction.

With this configuration, merely changing the installation orientation of the reaction tank can easily tilt the flow channel upward with respect to the horizontal direction. A general-purpose tubular member, for example, may be used as the reaction tank. Hence, the flexibility in selecting a material for the reaction tank is increased, and a small, lightweight material, for example, can be used, thereby decreasing the size and weight of the liquid treatment apparatus.

A liquid treatment apparatus according to another aspect of the present disclosure includes a flow channel, first and second electrodes, an insulator, a gas supply device, and a power supply source. The flow channel is provided for causing a liquid to flow therethrough. At least part of the first electrode is disposed within the flow channel. At least part of the second electrode is disposed within the flow channel. The insulator has a tubular shape and an opening on an end surface of the insulator, and surrounds a lateral surface of the first electrode with a space interposed between the insulator and the lateral surface of the first electrode. The gas supply device supplies a gas to the space and ejects the gas into the liquid via the opening. The power supply source applies a voltage between the first and second electrodes and generates plasma. The opening is positioned within at least part of the flow channel. The opening is opened obliquely with respect to a flowing direction of the liquid through the at least part of the flow channel.

With this configuration, the amount of plasma emission increases and discharging can be stabilized.

An axis of the insulator may be perpendicular to the end surface and may be inclined with respect to the flowing direction of the liquid.

By inserting a circular tubular insulator, for example, into the flow channel from an oblique direction with respect to the flowing direction of the liquid, the insulator and the flow channel can be combined with each other. It is only required to adjust the orientation of the flow channel and that of the insulator. This allows the use of a general-purpose reaction tank forming a flow channel and a general-purpose insulator. Hence, the flexibility in selecting a material for the reaction tank and that for the insulator is increased, and a small, lightweight material, for example, can be used, thereby decreasing the size and weight of the liquid treatment apparatus.

The axis of the insulator may obliquely intersect the end surface of the insulator.

Obliquely cutting of the end surface of the insulator, for example, can form the face of the opening positioned obliquely with respect to the flowing direction of the liquid. That is, merely changing the shape of the insulator can easily stabilize discharging.

The at least part of the flow channel may extend in a horizontal direction.

Even in a case in which the liquid flows through the flow channel in the horizontal direction, tilting of the face of the opening, which is an outlet for the gas, can stabilize discharging.

Embodiments of the present disclosure will be described below in detail with reference to the accompanying drawings.

All of the embodiments described below illustrate general or specific examples. Numeric values, configurations, materials, components, positions and connection states of the components, steps, and the order of steps illustrated in the following embodiments are only examples, and are not described for limiting the present disclosure. Among the components illustrated in the following embodiments, the components that are not recited in the independent claims which embody the broadest concept of the present disclosure will be described as optional components.

In the drawings, the components are only schematically illustrated and are not necessarily illustrated precisely. The sizes and dimensional ratios of the components in the drawings are not necessarily illustrated as actual sizes and ratios. The substantially same components are designated by like reference numeral, and the same explanation thereof will be simplified or omitted from the second time.

In the specification, terms representing the relationships between components, such as being parallel or perpendicular, terms representing the shapes of components, such as a cylinder, and the ranges of numeric values are not strictly restricted to those described in the specification, and include equivalent terms and ranges. For example, a certain range of numeric values includes allowance of about several percentage of differences.

First Embodiment

[1. Overview]

Figure 1:
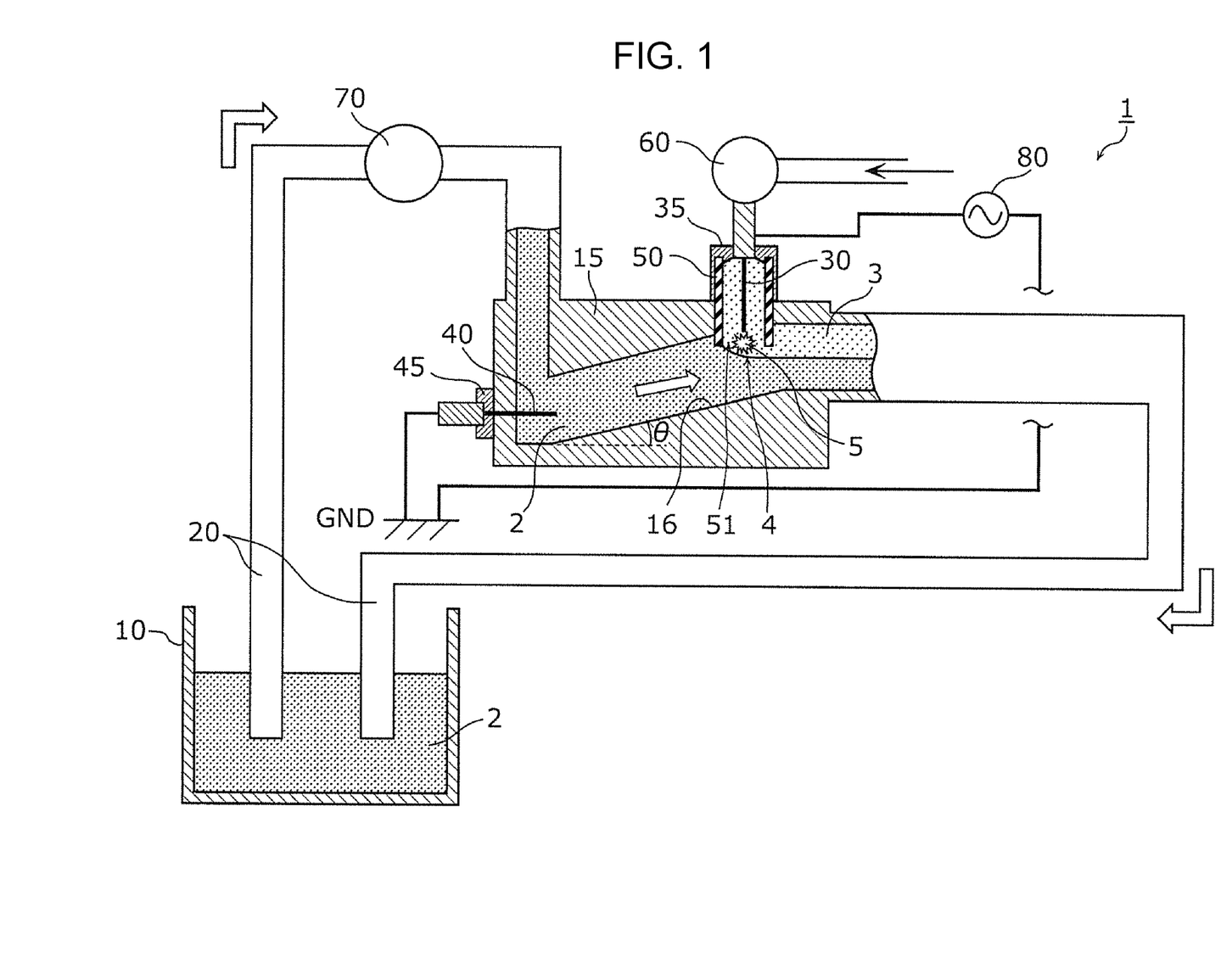
FIG. 1 illustrates the configuration of a liquid treatment apparatus according to a first embodiment.

An overview of a liquid treatment apparatus 1 according to a first embodiment will be described below with reference to FIG. 1. FIG. 1 illustrates the configuration of the liquid treatment apparatus 1 according to the first embodiment. In FIG. 1, examples of the sectional configurations of a treatment tank 10 for storing a liquid 2, a reaction tank 15 for treating the liquid 2 with plasma 5, and surrounding components are illustrated, and the configurations of other components, such as a piping 20 and a gas supply pump 60, are schematically illustrated.

As shown in FIG. 1, the liquid treatment apparatus 1 generates plasma 5 within a gas 3 which is emitted into the liquid 2. The gas 3 remains within the liquid 2 as bubbles. Concerning the bubbles formed by the gas 3, a gas-liquid interface 4 may be closed within the liquid 2 or may communicate with an outer space.

The liquid 2 is a subject on which the liquid treatment apparatus 1 performs treatments. The liquid 2 is, for example, water such as tap water or purified water, or an aqueous solution. The liquid 2 circulates between the treatment tank 10 and the reaction tank 15 via the piping 20. The three white arrows indicated in FIG. 1, one within the reaction tank 15 and two near the piping 20, represent the flowing directions of the liquid 2.

The liquid treatment apparatus 1 generates the plasma 5 within the gas 3 which is emitted into the liquid 2 so as to generate active species, which are reactive specifies, within the liquid 2. Examples of the active species are hydroxyl radical (OH), hydrogen radical (H), oxygen radical (O), superoxide anion ($O^{2-}$), monovalent oxygen ion ($O^-$), and hydrogen peroxide ($H_2O_2$). The generated active species decompose harmful substances contained in the liquid 2, for example. The liquid 2 containing active specifies may be used for sterilizing other substances.

[2. Configuration]

The configuration of the liquid treatment apparatus 1 according to the first embodiment will be discussed below.

As shown in FIG. 1, the liquid treatment apparatus 1 includes a treatment tank 10, a reaction tank 15, piping 20, a first electrode 30, a first holding portion 35, a second electrode 40, a second holding portion 45, an insulator 50, a gas supply pump 60, a liquid supply pump 70, and a power supply source 80. The individual elements forming the liquid treatment apparatus 1 will be discussed below in detail.

[2-1. Treatment Tank]

The treatment tank 10 is a container for storing the liquid 2. The outer configuration of the treatment tank 10 is any shape such as a rectangular parallelepiped, a cylinder, and a sphere. The treatment tank 10 may be a tray having a top portion opened.

The piping 20 is connected to the treatment tank 10. More specifically, the treatment tank 10 is connected to the reaction tank 15 via the piping 20. The liquid supply pump 70 is connected to the piping 20, and the liquid 2 circulates among the treatment tank 10, the reaction tank 15, and the piping 20.

The treatment tank 10 is made of an acid-resistant resin material, for example. The treatment tank 10 is made of fluoropolymers such as polytetrafluoroethylene, silicone rubber, polyvinyl chloride, stainless steel, or ceramic, for example.

[2-2. Reaction Tank and Flow Channel]

The reaction tank 15 is a tank within which at least part of the first electrode 30 and at least part of the second electrode 40 are disposed. More specifically, the first and second electrodes 30 and 40 are disposed to pass through walls of the reaction tank 15.

The reaction tank 15 contains a flow channel 16 through which the liquid 2 flows. The flow channel 16 is filled with the liquid 2. At least part of the first electrode 30 and at least part of the second electrode 40 are disposed within the flow channel 16. The gas 3 (bubbles) supplied from the gas supply pump 60 is emitted to the flow channel 16 via an opening 51 of the insulator 50. The plasma 5 is generated within the gas 3 as a result of causing the first and second electrodes 30 and 40 to discharge therebetween.

At a position at which the opening 51 of the insulator 50 is formed, the flow channel 16 tilts upward from the upstream side to the downstream side of the flow channel 16 with respect to the horizontal direction. Because of this configuration, in the vicinity of the opening 51 of the insulator 50 which surrounds the first electrode 30, the liquid 2 flows through the flow channel 16 obliquely upward with respect to the horizontal direction. The face of the opening 51 and the extending direction of the flow channel 16 intersect each other. In this specification, the extending direction of the flow channel 16 is the flowing direction of the liquid 2 through the flow channel 16. In the example of the liquid treatment apparatus 1 shown in FIG. 1, the extending direction of the flow channel 16 is a direction in which the flow channel 16 tilts upward at a tilt angle θ with respect to the horizontal direction.

The tilt angle θ of the flow channel 16 is shown in FIG. 1. The broken line indicated in FIG. 1, which serves as a base line for the tilt angle θ, is the horizontal direction. The tilt angle θ is 20° to 45°, for example, but it is not restricted to this range. Although in FIG. 1 the tilt angle θ of the flow channel 16 is uniform, it may change from the upstream side to the downstream side.

The sectional surface of the flow channel 16 is a circle, for example. The flow channel 16 is formed so that the area of any sectional surface along the circulating direction of the liquid 2 will be uniform. However, the flow channel 16 is not restricted to this configuration. The sectional surface of the flow channel 16 is not restricted to a circle, and may be a square or another polygon.

In the first embodiment, the reaction tank 15 is elongated in the direction in which it intersects the extending direction of the flow channel 16. For example, the reaction tank 15 may be a container in the form of a rectangular parallelepiped or a cylinder elongated with respect to the horizontal direction. However, the reaction tank 15 is not limited to this configuration. The reaction tank 15 may be a sealed reservoir tank or a tray having a top portion opened. The reaction tank 15 may be part of the piping 20.

The reaction tank 15 is made of an acid-resistant resin material, for example. The reaction tank 15 is made of fluoropolymers such as polytetrafluoroethylene, silicone rubber, polyvinyl chloride, stainless steel, or ceramic, for example.

[2-3. Piping]

The piping 20 is provided for forming a circulation path for the liquid 2, and is constituted by a tubular member such as a pipe, a tube, or a hose. The piping 20 is made of an acid-resistant resin or metal material, for example. The piping 20 is made of fluoropolymers such as polytetrafluoroethylene, silicone rubber, polyvinyl chloride, stainless steel, or ceramic, for example.

In the first embodiment, the piping 20 connects the treatment tank 10 and the liquid supply pump 70 and connects the liquid supply pump 70 and the reaction tank 15 so as to connect the reaction tank 15 and the treatment tank 10. In this manner, the piping 20 connects the treatment tank 10, the liquid supply pump 70, the reaction tank 15, and the treatment tank 10 in this order so as to form a circulation path for the liquid 2.

[2-4. First Electrode]

Figure 2:
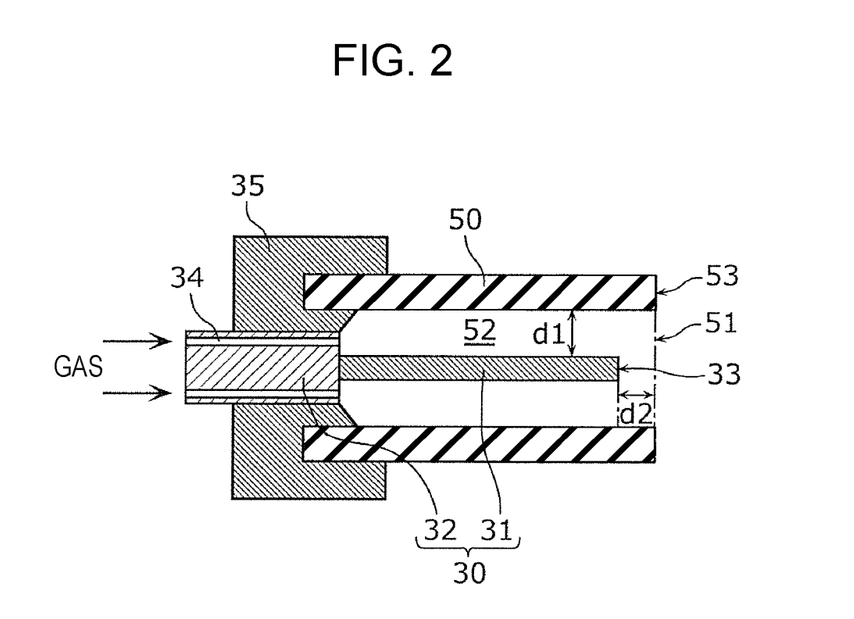
FIG. 2 is a sectional view of an example of a first electrode and an example of an insulator according to the first embodiment.

FIG. 2 is a sectional view of an example of the first electrode 30 and an example of the insulator 50 according to the first embodiment. More specifically, FIG. 2 is a cross sectional view of part of the liquid treatment apparatus 1 which passes through the long axis of the first electrode 30. As shown in FIG. 2, the first electrode 30 includes an electrode portion 31 and a screw portion 32.

The first electrode 30 is one of a pair of electrodes for generating the plasma 5. The first electrode 30 is used as a reaction electrode around which the plasma 5 is generated. The first electrode 30 serves as the anode.

The electrode portion 31 is an elongated cylindrical portion provided on the forward side of the first electrode 30. The diameter of the electrode portion 31 is as large as to generate the plasma 5, for example, 2 mm or smaller. In this example, the diameter of the electrode portion 31 is 0.8 mm.

The electrode portion 31 is made of tungsten, for example, but it is not restricted thereto. The electrode portion 31 may be made of another metal such as aluminum, iron, or copper, or an alloy of these metals.

At least part of the first electrode 30 is disposed within the flow channel 16. More specifically, the electrode portion 31 of the first electrode 30 is disposed within the flow channel 16 of the reaction tank 15, and contacts the liquid 2. As shown in FIG. 2, the electrode portion 31 is surrounded by the insulator 50 with a space 52 therebetween. When the gas 3 is supplied from the gas supply pump 60, it fills the space 52, so that the electrode portion 31 is covered by the gas 3 and does not contact the liquid 2.

In the first embodiment, the electrode portion 31 and the insulator 50 are coaxially disposed. The space 52 is formed between the electrode portion 31 and the insulator 50 so as to surround the entire circumference of the electrode portion 31. That is, the space 52 is a circular tubular space having a substantially uniform width d1. The width d1 is a distance between the outer lateral surface of the first electrode 30 and the inner lateral surface of the insulator 50. The width d1 is 1 to 3 mm, for example.

The screw portion 32 is a metallic member supporting the electrode portion 31. More specifically, the electrode portion 31 is pressed into the screw portion 32 and is fixed thereto.

The screw portion 32 is electrically connected to the electrode portion 31 and transmits power received from the power supply source 80 to the electrode portion 31.

The screw portion 32 is a cylindrical portion disposed on the rear side of the first electrode 30. The diameter of the screw portion 32 is greater than that of the electrode portion 31, and is 3 mm, for example. The screw portion 32 is made of a metal which is easy to work, such as iron.

The screw portion 32 is supported by the first holding portion 35. More specifically, a male thread is formed on the outer surface of the screw portion 32 and is screwed with a female thread formed on the first holding portion 35, so that the screw portion 32 can be supported by the first holding portion 35.

Through-holes 34 connected to the gas supply pump 60 are provided in the screw portion 32. The through-holes 34 communicate with the space 52. Hence, the gas 3 supplied from the gas supply pump 60 passes through the through-holes 34 and the space 52 and is then emitted to the liquid 2 flowing through the flow channel 16 of the reaction tank 15 via the opening 51 of the insulator 50.

In the first embodiment, two through-holes 34 are provided in the screw portion 32, as shown in FIG. 2. This reduces the pressure drop of the gas 3 in the through-holes 34. However, one through-hole 34 or three or more through-holes 34 may be provided.

As shown in FIG. 2, an end surface 33 of the first electrode 30 retreats from the face of the opening 51. An amount of retreat d2 is as large as to such a degree as to reduce the contact between the plasma 5 generated near the end surface 33 and the inner surface of the insulator 50. More specifically, the amount of retreat d2 of the end surface 33 of the first electrode 30 is 0 to 3 mm.

The amount of retreat d2 is adjustable by axially rotating the screw portion 32. Rotating of the screw portion 32 axially shifts the electrode portion 31 and the screw portion 32 together with respect to the insulator 50 held by the first holding portion 35. This makes it possible to vary the position of the end surface 33.

[2-5. First Holding Portion]

The first holding portion 35 is a member for holding the first electrode 30. In the first embodiment, the first holding portion 35 holds the first electrode 30 and the insulator 50 and fixes them to certain positions of the reaction tank 15.

The female thread is formed on the first holding portion 35 and is screwed with the male thread formed on the screw portion 32 of the first electrode 30. Rotating of the screw portion 32 axially can adjust the axial position of the first electrode 30 with respect to the first holding portion 35. The insulator 50 is fixed to the first holding portion 35 or the reaction tank 15. Thus, the position of the end surface 33 of the first electrode 30 with respect to the opening 51 of the insulator 50 can be adjusted. That is, the amount of retreat or the amount of protrusion of the end surface 33 can be adjusted.

[2-6. Second Electrode]

The second electrode 40 is the other one of the pair of electrodes for generating the plasma 5. The second electrode 40 serves as the cathode. At least part of the second electrode 40 is disposed within the flow channel 16 and contacts the liquid 2.

In the first embodiment, as shown in FIG. 1, the second electrode 40 is disposed on the farther upstream side than the first electrode 30 within the flow channel 16. The second electrode 40 may alternatively be disposed on the farther downstream side than the first electrode 30 within the flow channel 16. Alternatively, the second electrode 40 may be disposed at a position at which it opposes the first electrode 30 so as to be perpendicular to the flowing direction of the liquid 2.

The second electrode 40 has an elongated cylindrical portion, for example. In the first embodiment, the configuration, size, and material of the second electrode 40 may be the same as those of the first electrode 30, or may be different from those of the first electrode 30.

[2-7. Second Holding Portion]

The second holding portion 45 is a member for holding the second electrode 40. In the first embodiment, the second holding portion 45 holds the second electrode 40 and fixes it to a certain position of the reaction tank 15.

[2-8. Insulator]

As shown in FIG. 2, the insulator 50 is disposed to surround the lateral surface of the first electrode 30 with the space 52 therebetween. The insulator 50 is formed in a tubular shape having the opening 51 at an end surface 53 which contacts the liquid 2. In the first embodiment, the insulator 50 is an elongated circular tubular member which surrounds the lateral surface of the electrode portion 31 of the first electrode 30. The insulator 50 passes through the wall of the reaction tank 15 and is fixed to the reaction tank 15 so that the opening 51 can be positioned within the flow channel 16. More specifically, the insulator 50 is fixed by the first holding portion 35. The insulator 50 and the first electrode 30 are disposed such that the axial directions thereof coincide with the vertical direction, for example.

The inner diameter of the insulator 50 is greater than the outer diameter of the electrode portion 31. The electrode portion 31 and the insulator 50 are coaxially disposed. The space 52 is formed in the shape of a circular tube along the entire circumference of the electrode portion 31, and thus prevents the electrode portion 31 from contacting the insulator 50. The inner diameter of the insulator 50 is 3 mm, for example, and the outer diameter of the electrode portion 31 is 0.8 mm, for example. The width d1 of the space 52 is thus calculated to be 1.1 mm.

The gas 3 is supplied to the space 52 and is then emitted into the liquid 2 within the reaction tank 15 via the opening 51. The emitted gas 3 is diffused into the liquid 2 as bubbles. In this case, the opening 51 has the function of determining the largest size of the bubbles.

The insulator 50 is made of alumina ceramic, for example. Alternatively, the insulator 50 may be made of magnesia, zirconia, quartz, or yttrium oxide.

The shape of the insulator 50 is not restricted to a circular tube, but may be a square tube. The insulator 50 is held by the first holding portion 35, but may directly be fixed to the wall surface of the reaction tank 15.

[2-9. Gas Supply Pump]

The gas supply pump 60 supplies the gas 3 into the insulator 50 so as to emit the gas 3 into the liquid 2 via the opening 51. The gas supply pump 60 is connected to the screw portion 32 of the first electrode 30, for example. The gas supply pump 60 absorbs surrounding air, for example, and supplies it to the space 52 via the through-holes 34 of the screw portion 32 as the gas 30. The gas 3 supplied from the gas supply pump 60 is not restricted to air, but may be argon, helium, nitrogen gas, or oxygen gas.

In the first embodiment, the flow rate of the gas 3 supplied from the gas supply pump 60 is 0.5 liters per minute (L/min) or greater. The gas 3 supplied from the gas supply pump 60 pushes the liquid 2 filling the space 52 out of the opening 51 and covers the electrode portion 31. The gas 3 is emitted into the liquid 2 within the reaction tank 15 via the opening 51.

[2-10. Liquid Supply Pump]

The liquid supply pump 70 is an example of a liquid supply unit that circulates the liquid 2 between the treatment tank 10 and the reaction tank 15 via the piping 20. In the first embodiment, the liquid supply pump 70 is disposed at some midpoint in the piping 20.

[2-11. Power Supply Source]

The power supply source 80 applies a voltage to between the first and second electrodes 30 and 40 so as to generate the plasma 5. More specifically, the power supply source 80 applies a pulse voltage or an alternating current (AC) voltage to between the first and second electrodes 30 and 40.

The applied voltage is a positive-polarity high voltage pulse of 2 to 50 kV/cm at a frequency of 1 Hz to 100 kHz, for example. The voltage waveform may be any one of pulse, half-sine, and sine waves. The current flowing between the first and second electrodes 30 and 40 is 1 mA to 3 A, for example. In this example, the power supply source 80 applies a positive pulse voltage having a peak voltage of 4 kV at a frequency of 30 kHz.

[3. Operation]

The operation of the liquid treatment apparatus 1 according to the first embodiment will be described below.

In the liquid treatment apparatus 1, the gas supply pump 60 supplies the gas 3 while the liquid supply pump 70 is circulating the liquid 2. The gas 3 is supplied to the space 52 via the through-holes 34 of the screw portion 32. The liquid 2 which has filled the space 52 is then emitted into the liquid 2 within the reaction tank 15 via the opening 51. The flow rate of the gas 3 is 0.8 L/min, for example. The gas 3 fills the space 52 and thus covers the electrode portion 31 of the first electrode 30. Hence, the first electrode 30 is insulated from the liquid 2.

The power supply source 80 applies a voltage, for example, a positive pulse voltage having a peak voltage of 4 kV at a frequency of 30 kHz, to between the first and second electrodes 30 and 40. This generates discharging between the end surface 33 of the first electrode 30 and the gas-liquid interface 4, so that the plasma 5 can be generated within the gas 3 (bubbles) which cover the electrode portion 31. Active species are generated by the plasma 5 and are absorbed into the liquid 2. The liquid 2 is circulating, and thus, the active species fill the entirety of the liquid 2.

[4. Advantages]

Advantages achieved by the liquid treatment apparatus 1 according to the first embodiment will be described below with reference to FIGS. 3 and 4 by means of comparison with a known liquid treatment apparatus.

Figure 3:
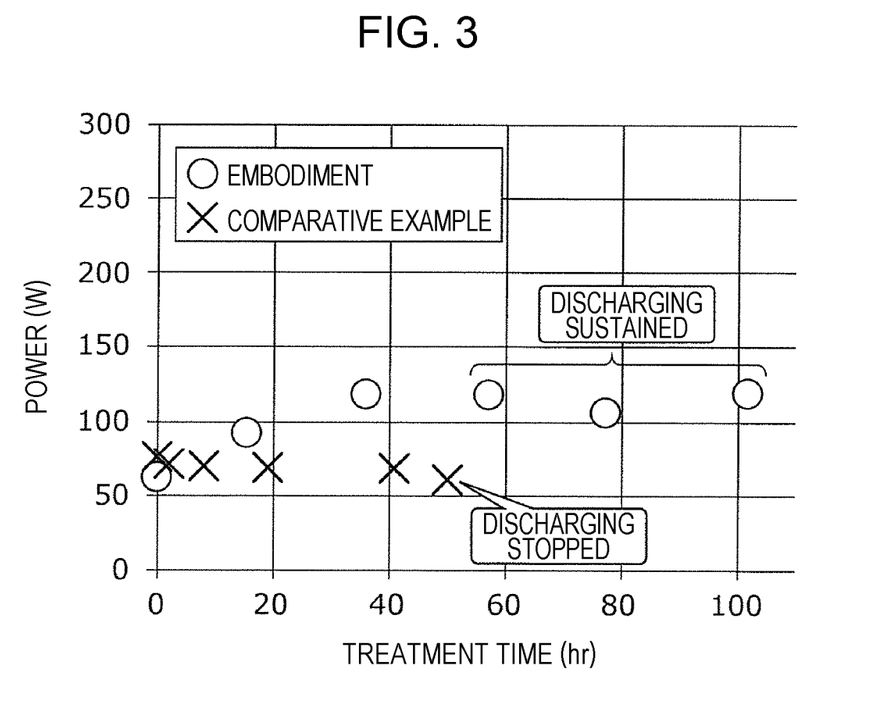
FIG. 3 is a graph illustrating discharging sustainability of the liquid treatment apparatus according to the first embodiment and that according to a comparative example.

FIG. 3 is a graph illustrating discharging sustainability of the first embodiment and that of a comparative example. FIG. 4 is a sectional view of the configuration of a reaction tank 115 and surrounding components of a liquid treatment apparatus according to the comparative example.

Figure 4:
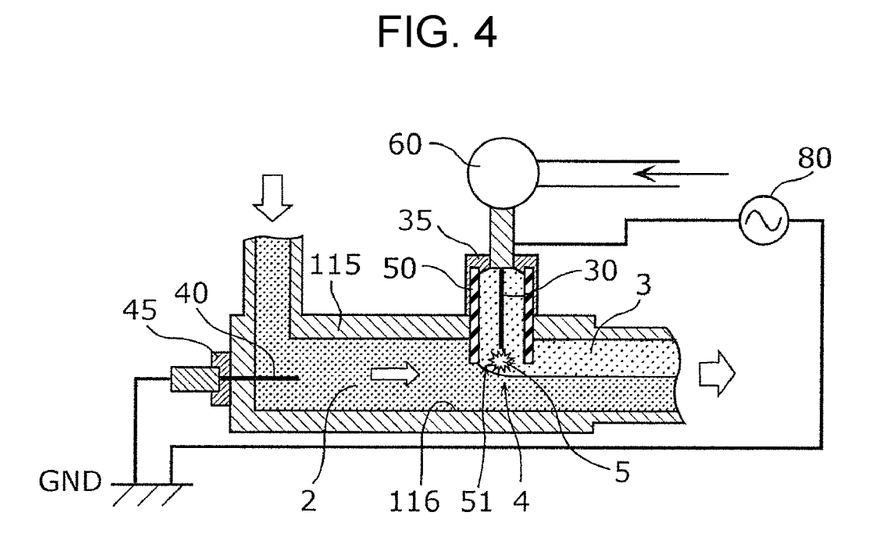
FIG. 4 is a sectional view of the configuration of a reaction tank and surrounding components of a liquid treatment apparatus according to the comparative example.

As shown in FIG. 4, in the reaction tank 115 of the liquid treatment apparatus according to the comparative example, a flow channel 116 does not tilt with respect to the horizontal direction, and instead, it extends in the horizontal direction. The insulator 50 is disposed perpendicularly to the flowing direction of the liquid 2 through the flow channel 116 (that is, the extending direction of the flow channel 116). That is, the face of the opening 51 of the insulator 50 is parallel with the extending direction of the flow channel 116 (more specifically, the horizontal direction).

The present inventor performed treatments of a subject liquid by using the liquid treatment apparatus of the comparative example shown in FIG. 4. The subject liquid was composite water containing 150 ppm of silica ($Na_2SiO_3$), 25.1 ppm of $CaCl_2.2H_2O$, 42.0 ppm of $MgSO_4.7H_2O$, 99 ppm of $NaHCO_3$, and 21.5 ppm of $KHCO_3$. The diameter of the insulator 50 was 10 mm.

As indicated by plotting of the cross mark "X" in FIG. 3, in the liquid treatment apparatus of the comparative example, discharging became unstable and stopped in 50 hours after discharging started. More specifically, discharging power was substantially constant with the lapse of time, and immediately before discharging stopped, discharging became unstable with a decreased amount of light emission.

In contrast, a liquid treatment apparatus according to an aspect of the present disclosure includes a flow channel 16, first and second electrodes 30 and 40, an insulator 50, a gas supply pump 60, and a power supply source 80. The flow channel 16 is provided for causing a liquid 2 to flow therethrough. At least part of the first electrode 30 and at least part of the second electrode 40 are disposed within the flow channel 16. The insulator 50 is formed in a tubular shape and includes an opening 51 at an end surface 53. The insulator 50 surrounds the lateral surface of the first electrode 30 with a space 52 therebetween. The gas supply pump 60, which serves as a gas supply device, supplies a gas 3 to the space 52 and emits the gas 3 into the liquid 2 via the opening 51. The power supply source 80 applies a voltage to between the first and second electrodes 30 and 40 and generates plasma 5. At least part of the flow channel 16 extends in a direction which is inclined with respect to the horizontal direction so that the liquid 2 can flow obliquely upward with respect to the horizontal direction. The opening 51 is positioned within this part of the flow channel 16.

With this configuration, the amount of plasma emission increases and discharging becomes stable. More specifically, as indicated by plotting of the circles in FIG. 3, discharging stably continues up to more than 100 hours. The reason for this may be as follows. The distance between the gas-liquid interface 4 and the end surface 33 of the first electrode 30 is decreased, so that the shape of the bubbles of the gas 3 becomes smaller and is also stabilized.

As described above, the liquid treatment apparatus 1 according to the first embodiment can stabilize discharging.

Modified Example

Figure 5:
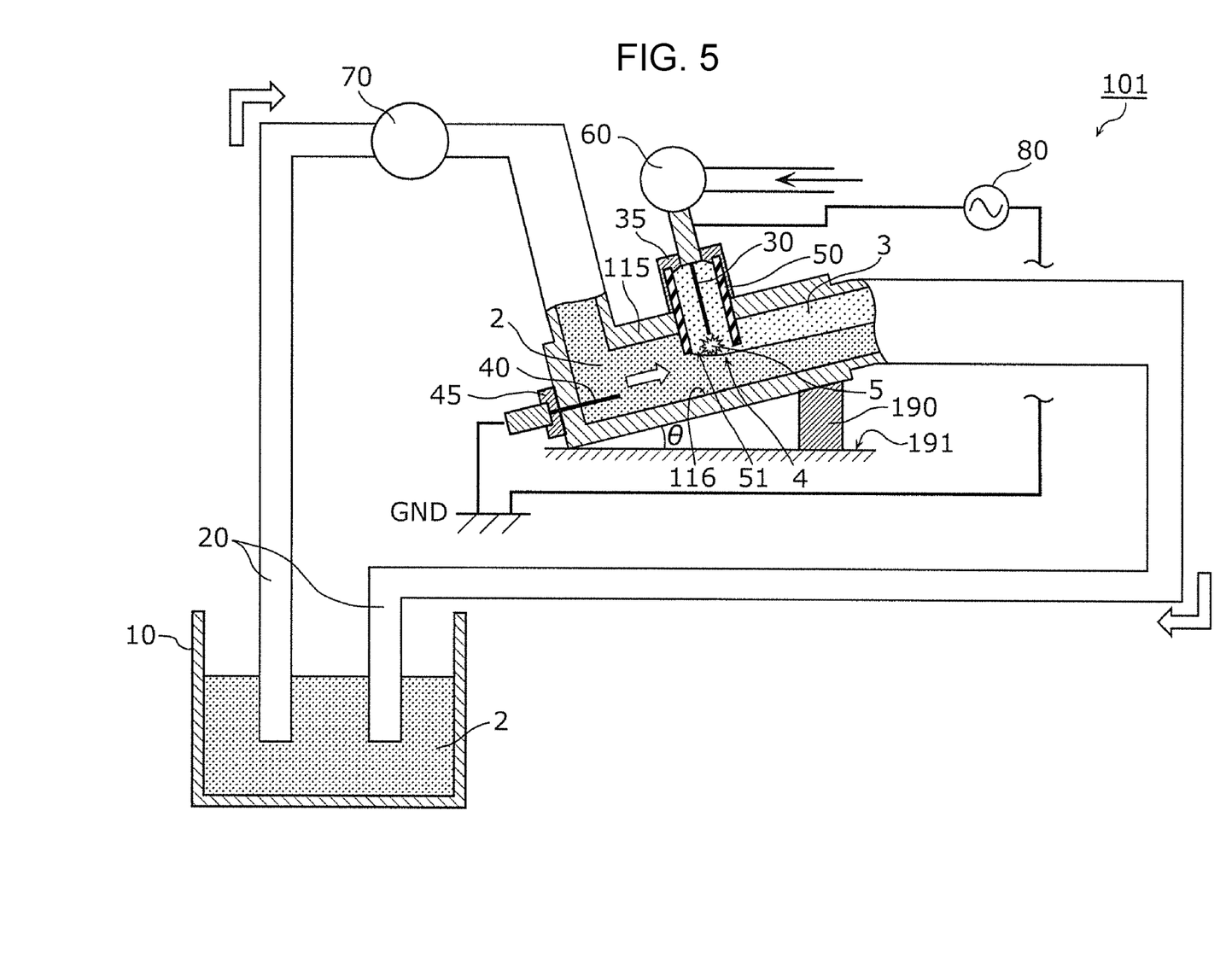
FIG. 5 illustrates the configuration of a liquid treatment apparatus according to a modified example of the first embodiment.

A modified example of the first embodiment will be described below with reference to FIG. 5. FIG. 5 illustrates the configuration of a liquid treatment apparatus 101 according to the modified example.

As shown in FIG. 5, the liquid treatment apparatus 101 according to this modified example is different from the liquid treatment apparatus 1 of the first embodiment in that it includes a reaction tank 115 instead of the reaction tank 15 and also includes a support portion 190 for supporting the reaction tank 115. The liquid treatment apparatus 101 will be described below mainly by referring to the points different from the counterpart of the first embodiment, and a detailed explanation of the same points will be simplified or omitted.

The reaction tank 115 is the same as that of the above-described comparative example shown in FIG. 4. The reaction tank 115 is configured in a shape elongated in the extending direction of the flow channel 116. The reaction tank 115 is formed in a circular tube or a square tube, for example. In the vicinity of the opening 51 of the insulator 50 which surrounds the first electrode 30, the liquid 2 flows through the flow channel 16 obliquely upward with respect to the horizontal direction. In this modified example, the face of the opening 51 and the extending direction of the flow channel 116 (that is, the flowing direction of the liquid 2) are parallel with each other.

As shown in FIG. 5, the reaction tank 115 is disposed to tilt with respect to the horizontal direction. In this modified example, the reaction tank 115 is supported by the support portion 190 so as to tilt at a tilt angle θ with respect to a horizontal plane 191. The reaction tank 115 is disposed obliquely, so that the flow channel 116 also tilts upward from the upstream side to the downstream side of the flow channel 116 with respect to the horizontal direction.

In this modified example, the insulator 50 and the first electrode 30 are disposed to vertically pass through the side wall of the reaction tank 115. The insulator 50 and the first electrode 30 thus tilt with respect to the vertical direction and the horizontal direction. The axial direction of the insulator 50 and that of the first electrode 30 are perpendicular to the flowing direction of the liquid 2 through the flow channel 116.

The support portion 190 is a member that is positioned between the reaction tank 115 and the horizontal plane 191 and supports the reaction tank 115 in a tilting state. The shape, size, and material of the support portion 190 are not restricted to a particular shape, size, and material. The member that supports the reaction tank 115 in a tilting state is not limited to the support portion 190. For example, the reaction tank 115 may be fixed to a predetermined wall surface such that the flow channel 116 is positioned obliquely upward. The reaction tank 115 may alternatively be suspended from above.

As described above, in the liquid treatment apparatus 101 according to this modified example, by disposing the reaction tank 115 obliquely with respect to the horizontal direction, the flow channel 116 also tilts upward from the upstream side to the downstream side with respect to the horizontal direction.

With this configuration, discharging can be stabilized, as in the first embodiment.

Second Embodiment

A second embodiment will be described below.

In the first embodiment, the flow channel 16 tilts upward from the upstream side to the downstream side with respect to the horizontal direction. In the second embodiment, a flow channel 116 extends in the horizontal direction. The second embodiment will be described below mainly by referring to the points different from the first embodiment, and a detailed explanation of the same points will be simplified or omitted.

Figure 6:
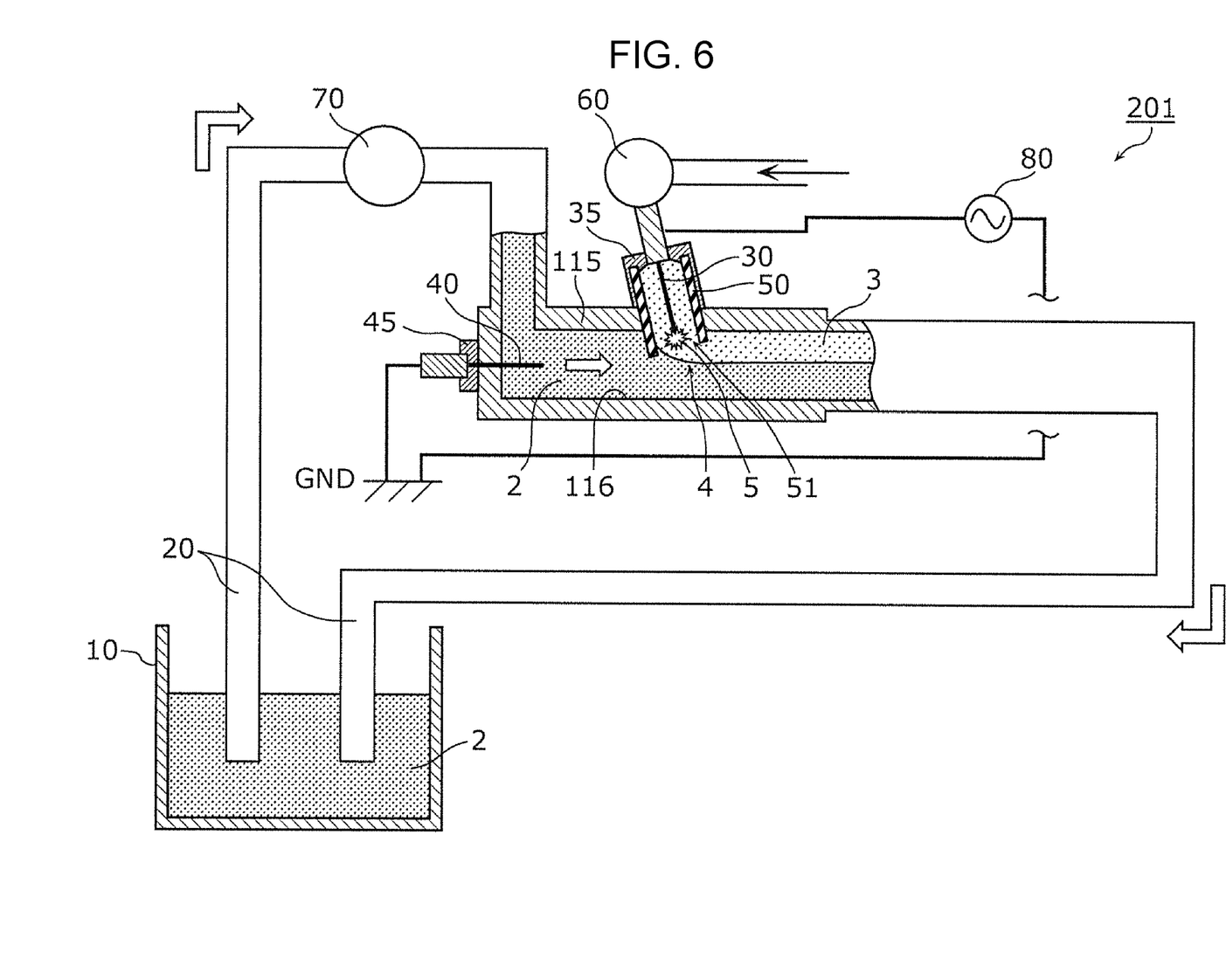
FIG. 6 illustrates the configuration of a liquid treatment apparatus according to a second embodiment.

FIG. 6 illustrates the configuration of a liquid treatment apparatus 201 according to the second embodiment. As shown in FIG. 6, the liquid treatment apparatus 201 is different from the liquid treatment apparatus 1 of the first embodiment in that it includes a reaction tank 115 instead of the reaction tank 15 and that the first electrode 30 and the insulator 50 are disposed to tilt with respect to the flow channel 116.

The reaction tank 115 is the same as the reaction tank 115 used in the modified example of the first embodiment shown in FIG. 5. In the second embodiment, the support portion 190 is not provided, and the reaction tank 115 is disposed along the horizontal direction. More specifically, the flow channel 116 contained in the reaction tank 115 extends in the horizontal direction, and the liquid 2 flows in the horizontal direction.

In the second embodiment, the face of the opening 51 of the insulator 50 tilts upward from the upstream side to the downstream side of the flow channel 116. That is, the opening 51 is opened obliquely with respect to the flowing direction of the liquid 2 through the flow channel 116. The tilt angle of the face of the opening 51 is 20° to 45°, for example, but it is not restricted to this range.

The axial direction of the insulator 50 is perpendicular to the face of the opening 51, and tilts with respect to the extending direction of the flow channel 116. More specifically, the insulator 50 is a circular tubular member or a square tubular member including an end surface 53 which is perpendicular to the axial direction of the insulator 50. The insulator 50 is disposed to obliquely intersect the extending direction of the flow channel 116.

As described above, in the liquid treatment apparatus 201 according to the second embodiment, the face of the opening 51 of the insulator 50 tilts upward from the upstream side to the downstream side of the flow channel 116.

With this configuration, the distance between the gas-liquid interface 4 and the end surface 33 of the first electrode 30 is decreased, so that the shape of the bubbles of the gas 3 becomes smaller and is also likely to be stabilized. As a result, the liquid treatment apparatus 201 of the second embodiment, as well as the counterpart of the first embodiment, can stabilize discharging.

Modified Example

Figure 7:
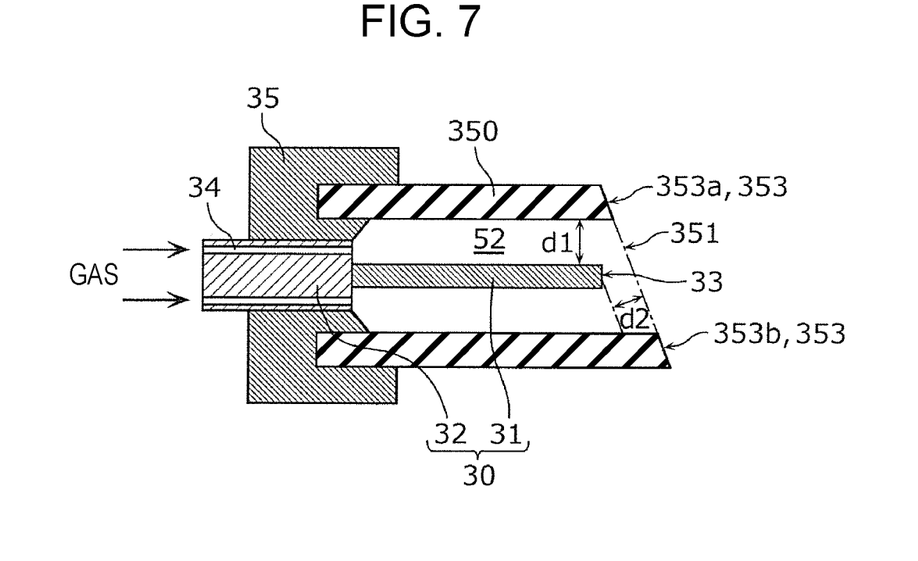
FIG. 7 is a sectional view of an example of a first electrode and an example of an insulator according to a modified example of the second embodiment.
Figure 8:
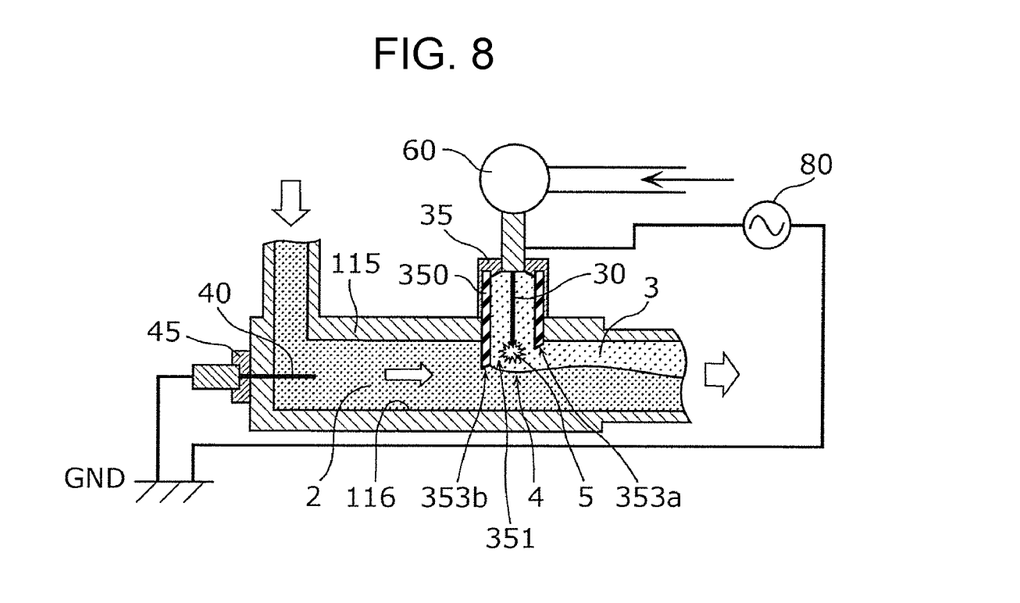
FIG. 8 is a sectional view of the configuration of a reaction tank and surrounding components of a liquid treatment apparatus according to the modified example of the second embodiment.

A modified example of the second embodiment will be described below with reference to FIGS. 7 and 8. FIG. 7 is a sectional view of an example of a first electrode 30 and an example of an insulator 350 according to the modified example. FIG. 8 is a sectional view of the configuration of a reaction tank 115 and surrounding components of a liquid treatment apparatus according to the modified example.

As shown in FIGS. 7 and 8, the liquid treatment apparatus of this modified example is different from the liquid treatment apparatus 201 of the second embodiment in that it includes the insulator 350 instead of the insulator 50. The modified example will be described below mainly by referring to the points different from the second embodiment, and a detailed explanation of the same points will be simplified or omitted.

As shown in FIG. 7, in this modified example, an end surface 353 of the insulator 350 is flush with the face of an opening 351 and also tilts with respect to the axial direction of the insulator 350. More specifically, the insulator 350 is configured in a shape in which part of a circular tube is obliquely cut. The cut plane corresponds to the end surface 353 and the face of the opening 351. The end surface 353 includes an end surface portion 353a on the shorter side of the insulator 350 and an end surface portion 353b on the longer side of the insulator 350.

The end surface 33 of the first electrode 30 retreats farther backward than the face of the opening 351. The face of the opening 351 is indicated by the long dashed dotted line which connects the end surface portions 353a and 353b in FIG. 7. More specifically, as shown in FIG. 7, the end surface 33 retreats farther backward than the end surface portion 353a. The end surface 33 may alternatively protrude farther than the end surface portion 353a if it retreats farther backward than the face of the opening 351.

As shown in FIG. 8, the insulator 350 and the first electrode 30 are disposed such that the axial directions thereof are positioned perpendicularly to the extending direction of the flow channel 116. In this case, the end surface portion 353b is positioned on the upstream side of the flow channel 116, while the end surface portion 353a is positioned on the downstream side of the flow channel 116.

With this configuration, the face of the opening 351 tilts upward from the upstream side to the downstream side of the flow channel 116.

As described above, in the liquid treatment apparatus of this modified example, the face of the opening 351 of the insulator 350 tilts upward from the upstream side to the downstream side of the flow channel 116.

With this configuration, discharging can be stabilized, as in the second embodiment.

Other Embodiments

The liquid treatment apparatuses according to one or plural aspects have been described through illustration of the embodiments. However, the present disclosure is not restricted to the above-described embodiments. Without departing from the spirit and scope of the disclosure, various modifications apparent to practitioners skilled in the art may be made to the embodiments and components in the different embodiments may be combined with each other to form other aspects of the disclosure. Such aspects are also encompassed within the scope of the disclosure.

In the above-described embodiments, the position of the end surface 33 of the electrode portion 31 is adjustable by rotating the screw portion 32. However, the positional relationship between the electrode portion 31 and the insulator 50 may be fixed. More specifically, a female thread may not be formed on the first holding portion 35, and a male thread may not be formed on the screw portion 32.

In the above-described embodiments, the first electrode 30 includes the electrode portion 31 and the screw portion 32. However, the first electrode 30 may be a single bar-like electrode. The first electrode 30 may be a square tubular or flattened electrode. The second electrode 40 may also be formed in a similar manner. Additionally, plural first electrodes 30 and/or plural insulators 50 may be provided.

In the liquid treatment apparatus 1, 101, or 201, at least one of the first and second holding portions 35 and 45 may be omitted, and at least the corresponding one of the first and second electrodes 30 and 40 may directly be fixed to the reaction tank 15 or 115.

In the second embodiment, the flow channel 116 may not be parallel with the horizontal direction, but may tilt with respect to the horizontal direction.

In the modified example of the second embodiment, the insulator 350 is configured in a shape in which the end surface 353 is obliquely cut. However, the insulator 350 is not restricted to this configuration. The end surface 353 may be a curved surface.

Various changes, replacements, addition, omission may be made to the above-described embodiments within the spirit and scope of the disclosure defined by the following claims and their equivalents.

What is claimed is:

1. A liquid treatment apparatus comprising:
a flow channel for causing a liquid to flow therethrough;
a first electrode at least part of which is disposed within the flow channel;
a second electrode at least part of which is disposed within the flow channel;
an insulator having a tubular shape and an opening on an end surface of the insulator, the insulator surrounding a lateral surface of the first electrode with a space interposed between the insulator and the lateral surface of the first electrode;
a gas supply device that supplies a gas to the space and ejects the gas into the liquid via the opening; and
a power supply source that applies a voltage between the first and second electrodes and generates plasma, wherein
at least part of the flow channel extends in a first direction which is inclined with respect to a horizontal direction so that the liquid flows obliquely upward with respect to the horizontal direction, and
the opening is positioned within the at least part of the flow channel.

2. The liquid treatment apparatus according to claim 1, further comprising:
a reaction tank containing the flow channel,
wherein the insulator passes through a wall of the reaction tank and is fixed to the reaction tank.

3. The liquid treatment apparatus according to claim 2, wherein the reaction tank is elongated in a direction which intersects the first direction.

4. The liquid treatment apparatus according to claim 2, wherein the reaction tank is elongated in the first direction and is disposed such as to be inclined with respect to the horizontal direction.

5. A liquid treatment apparatus comprising:
a flow channel for causing a liquid to flow therethrough;
a first electrode at least part of which is disposed within the flow channel;
a second electrode at least part of which is disposed within the flow channel;
an insulator having a tubular shape and an opening on an end surface of the insulator, the insulator surrounding a lateral surface of the first electrode with a space interposed between the insulator and the lateral surface of the first electrode;
a gas supply device that supplies a gas to the space and ejects the gas into the liquid via the opening; and
a power supply source that applies a voltage between the first and second electrodes and generates plasma, wherein
the opening is positioned within at least part of the flow channel,
the opening is opened obliquely with respect to a flowing direction of the liquid through the at least part of the flow channel, and
wherein an axis of the insulator obliquely intersects the end surface.

6. The liquid treatment apparatus according to claim 5, wherein the at least part of the flow channel extends in a horizontal direction.

* * * * *